(12) United States Patent
Fleissner et al.

(10) Patent No.: US 9,054,042 B2
(45) Date of Patent: Jun. 9, 2015

(54) SURFACE PLANARISATION

(75) Inventors: Arne Fleissner, Regensburg (DE);
Surama Malik, Cambridge (GB); Colin Baker, Willingham (GB); Laurence Scullion, Great Cambourne (GB);
Jeremy Burroughes, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/009,069

(22) PCT Filed: Mar. 21, 2012

(86) PCT No.: PCT/GB2012/000259
§ 371 (c)(1),
(2), (4) Date: Nov. 21, 2013

(87) PCT Pub. No.: WO2012/131288
PCT Pub. Date: Oct. 4, 2012

(65) Prior Publication Data
US 2014/0084272 A1    Mar. 27, 2014

(30) Foreign Application Priority Data
Mar. 30, 2011    (GB) .................................. 1105364.2

(51) Int. Cl.
*H01L 29/76*    (2006.01)
*H01L 21/306*    (2006.01)
(Continued)

(52) U.S. Cl.
CPC ............ *H01L 21/306* (2013.01); *G03F 7/2022* (2013.01); *H01L 51/0003* (2013.01);
(Continued)

(58) Field of Classification Search
CPC ....................................................... H01L 51/00
USPC ........... 257/E29.255, E51.001, E51.024, 288, 257/40, 734; 438/299, 99
See application file for complete search history.

(56) References Cited

U.S. PATENT DOCUMENTS

| 4,539,507 A | 9/1985 | VanSlyke et al. |
| 4,882,245 A | 11/1989 | Gelorme et al. |

(Continued)

FOREIGN PATENT DOCUMENTS

| EP | 1 944 775 A1 | 7/2008 |
| EP | 1 998 218 A1 | 12/2008 |

(Continued)

OTHER PUBLICATIONS

Fehse et al., "Highly Efficient OLEDs on ITO-Free Polymeric Substrates," *Proc. SPIE*, vol. 6192 (2006).
(Continued)

*Primary Examiner* — Telly Green
(74) *Attorney, Agent, or Firm* — Marshall, Gerstein & Borun LLP

(57) ABSTRACT

This invention generally relates to planarisation of a surface of a substrate. In an embodiment of planarising a surface region of a substrate, the substrate having a body on a portion of said surface region, the method comprises: modifying the wetability of a surface of said body with respect to a liquid planariser composition by providing a surface modifying layer such as a self-assembled monolayer thereon; and then depositing the liquid planariser composition on said substrate and said body such that the planariser composition wets said surface region, wherein said surface modifying layer determines a contact angle of said liquid planariser composition to said surface of said body such that the deposited liquid planariser composition is repelled from said surface of said body.

9 Claims, 5 Drawing Sheets

(51) Int. Cl.
*G03F 7/20* (2006.01)
*H01L 51/00* (2006.01)
*H01L 51/52* (2006.01)
*H01L 29/02* (2006.01)

(52) U.S. Cl.
CPC ........ *H01L51/0018* (2013.01); *H01L 51/5212* (2013.01); *H01L 2251/5361* (2013.01); *H01L 2251/5392* (2013.01); *Y02E 10/549* (2013.01); *H01L 29/02* (2013.01); *H01L 51/0001* (2013.01); *H01L 51/0096* (2013.01)

(56) References Cited

U.S. PATENT DOCUMENTS

| | | | |
|---|---|---|---|
| 5,010,027 | A | 4/1991 | Possin et al. |
| 5,597,747 | A | 1/1997 | Chen |
| 6,674,106 | B2 | 1/2004 | Tanaka et al. |
| 7,445,953 | B2 | 11/2008 | Lu et al. |
| 2007/0012950 | A1* | 1/2007 | Cain et al. ............. 257/194 |
| 2007/0264814 | A1 | 11/2007 | Hirai et al. |
| 2009/0166612 | A1* | 7/2009 | Cain et al. ............. 257/40 |

FOREIGN PATENT DOCUMENTS

| | | |
|---|---|---|
| GB | 2 427 509 A | 12/2006 |
| JP | 58-028833 | 2/1983 |
| JP | 60-103677 | 6/1985 |
| JP | 11-65127 | 3/1999 |
| JP | 11-73646 | 3/1999 |
| WO | WO-90/13148 A1 | 11/1990 |
| WO | WO-95/06400 A1 | 3/1995 |
| WO | WO-99/48160 A1 | 9/1999 |
| WO | WO-2007/110671 A2 | 10/2007 |
| WO | WO-2009/108574 A2 | 9/2009 |

OTHER PUBLICATIONS

Harkema et al., "Large Area ITO-Free Flexible White OLEDs with Orgacon™ PEDOT:PSS and Printed Metal Shunting Lines," *Proc. SPIE*, vol. 7415 (2009).

Leo, "Organic Lighting and Organic Solar Cells," Presentation from Comedd-Opening on Oct. 30, 2008.

Osram Datasheet, "ORBEOS™ for OLED Lighting," (2009). Abstract only.

Zhao et al., "Self-Aligned Inkjet Printing of Highly Conducting Gold Electrodes with Submicron Resolution," *J. Appl. Phys.*, 101 (6):064513 (2007).

International Preliminary Report on Patentability for Application No. PCT/GB2012/000259, dated Oct. 1, 2013.

International Search Report and Written Opinion for Application No. PCT/GB2012/000259, dated Jun. 5, 2012.

Search Report for Application No. GB1105364.2, dated Aug. 18, 2011.

Search Report for Application No. GB1105364.2, dated Jun. 28, 2011.

* cited by examiner

SURFACE PLANARISATION

FIELD OF THE INVENTION

The present invention generally relates to planarisation of an initially non-planar surface, such as infill planarisation for Lighting Panel tracking.

More specifically, the invention relates to a method of planarising a surface region of a substrate, and to a substrate comprising a surface region, a body on a portion of said surface region and a planariser composition on said surface region, and more particularly to methods of forming an electronic device such as, for example, an Organic Light Emitting Diode (OLED), a Lighting Panel, a display backlight, an integrated circuit, and an Organic Photovoltaic (OPV) device, these methods comprising the method of planarising, and further relates to an electronic device comprising the substrate, such as, for example, an OLED comprising the substrate, a Lighting Panel comprising a plurality of the OLEDs, a display backlight comprising a plurality of the OLEDs, an Integrated Circuit (IC) comprising the substrate, and an OPV comprising the substrate.

In addition, the invention relates to a method of planarising a surface region of a substrate, and to a substrate comprising a surface region having a substantially planar surface, and more particularly to methods of forming an electronic device such as, for example, an OLED, a Lighting Panel, a display backlight, an IC, and OPV, these methods comprising the method of planarising, and further relates to an electronic device such as, for example, an OLED comprising the substrate, a Lighting Panel comprising a plurality of the OLEDs, a display backlight comprising a plurality of the OLEDs, an IC comprising the substrate, and an OPV comprising the substrate.

BACKGROUND TO THE INVENTION

Organic light emitting diodes (OLEDs) are particularly useful for lighting because they can relatively easily and cheaply be fabricated to cover a large area on a variety of substrates. They are also bright and may be coloured (e.g. red, green and blue) or white as desired. In this specification references to OLEDs include organometallic LEDs, and OLEDs fabricated using either polymers or small molecules. Examples of polymer-based OLEDs are described in WO 90/13148, WO 95/06400 and WO 99/48160; examples of so-called small molecule based OLEDs are described in U.S. Pat. No. 4,539,507.

To aid in understanding embodiments of the invention it is helpful to describe an example structure of an OLED device. It is worth noting that when operated under reverse polarity the OLED can function as an OPV. Thus referring to FIG. 1a, this shows a vertical cross-section through a portion of an OLED device 10 (e.g., display backlight OLED, OLED lighting tile or OLED lighting panel) comprising a glass substrate 12 on which metal, for example copper tracks 14, are deposited to provide a first electrode connection, in the illustrated example an anode connection. A hole injection layer 16 is deposited over the anode electrode tracking, for example a conductive transparent polymer such as PEDOT:PSS (polystyrene-sulphonate-doped polyethylene-dioxythiophene). This is followed by a light emitting polymer (LEP) stack 18, for example comprising a PPV (poly(p-phenylenevinylene)-based material. The hole injection layer helps to match the hole energy levels of the LEP stack to the anode metal. This is followed by a cathode stack 20, for example comprising a low work function metal such as calcium or barium (for the LEP stack and cathode electron energy level matching) or an electron injection layer such as lithium fluoride, over which is deposited a reflective back electrode, for example of aluminium or silver.

The example of FIG. 1a is a "bottom emitter" device in which light is emitted through the transparent substrate, e.g. glass or plastic. However a "top emitter" device may also be fabricated in which an upper electrode of the device is substantially transparent, for example fabricated from indium tin oxide (ITO) or a thin layer of cathode metal (say less than 100 nm thickness). Referring now to FIG. 1b this shows a view of the OLED device 10 of FIG. 1a looking towards the LEP stack 18 through the substrate 12, that is looking into the light-emitting face of the device through the "bottom" of the device. This view shows that the anode electrode tracks 14 are, in this example, configured as a hexagonal grid or mesh, in order to avoid obscuring too much light emitted from the LEP stack 18. The (anode) electrode tracks 14 are connected to a solid metal busbar 30 which runs substantially all the way around the perimeter of the device, optionally with one or more openings 32, which may be bridged by an electrical conductor to facilitate a connection to the cathode layer of the device.

FIG. 1c shows a Lighting Panel 100 comprising a plurality of OLEDs 10 having a structure as shown in FIGS. 1a and/or 1b.

Metal tracking lines such as anode tracks 14 are provided in OLEDs to increase the conductivity of an electrode in the device and thus enable current distribution over a wide area. However, deposition of active OLED layers on top of a non-planar surface may result in thickness and/or contour variations, i.e., non-planar surface regions, of the layers. Such variations may for example result in luminance non-uniformities, device instabilities and/or electrical shorts in the device. Edges of the metal tracks may cause such thickness and/or contour variations. Thus, metal tracking in Lighting Panels comprising OLEDs is preferably planarised prior to processing of the light-emitting and associated (e.g., charge injection) layers.

The field of substrate planarisation however continues to provide a need for a planarisation technique that provides an improvement in relation to one or more of, interalia, surface planarity, process complexity, processing time, process/device cost, light outcoupling through a planarised surface, electrical conduction from tracking to a layer (e.g., hole injection or light emissive layer) associated with light emission, contamination of an active area of a lighting device, corrosion of metal tracks, OLED cavity tuning, etc.

For use in understanding the present invention, the following disclosures are referred to:
Proc. SPIE, Vol. 7415, 74150T (2009), Harkema et al;
Journal of Applied Physics 101 (2007) 064513, Zhao et al;
U.S. Pat. No. 5,010,027, Possin et al, published 1991 Apr. 23;
U.S. Pat. No. 5,597,747, Chen, published 1997 Jan. 28;
Presentation from Comedd-Opening on Oct. 30, 2008, "Organic Lighting and Organic Solar Cells", Prof. Dr. Karl Leo, Fraunhofer IPMS, available from http://www.ipms.fraunhofer.de/common/comedd/presentation/leo.pdf;
Osram Datasheet "ORBEOS™ for OLED Lighting", dated 2009 Nov. 18, available at least from May 18, 2010, available from http://www.osram-os.com/osram_os/EN/Products/Product_Promotions/OLED_Lighting/Technical_Information/index.html; and
Proc. SPIE, Vol. 6192, 61921Z-1 (2006), Fehse et al.

SUMMARY

According to a first aspect of the present invention, there is provided a method of planarising a surface region of a substrate, the substrate having a body on a portion of said surface region, the method comprising: modifying the wetability of a surface of said body with respect to a liquid planariser composition; and then depositing the liquid planariser composition on said substrate such that the planariser composition wets said surface region of said substrate, wherein said modifying determines a contact angle of said liquid planariser composition to the surface of said body such that the deposited liquid planariser composition is repelled from the surface of said body.

Thus, at least a portion of an entire surface may be planarised. Where the method is performed with at least two bodies, the repelled liquid planariser composition may be regarded as 'infill' between the bodies (which may be separate bodies or different portions of a single body). The location of the or each body on a portion of the surface region may mean that some of the surface region remains exposed after each body is formed directly on the surface region.

While the method may comprise steps of the modifying and then the depositing, this does not exclude that there may be intermediate steps between these two steps.

The wetting may involve the planariser composition attaching, adhering and/or binding to the surface region, the planariser composition preferably being repelled by the body surface but not by the surface region, e.g., the planariser composition selectively attaches to the surface region in preference to the body surface.

Due to the repelling, the deposited planariser composition may substantially de-wet from the body surface. This may further be the case in other related methods that differ in that for example the planariser is deposited directly onto only the body and due to the de-wetting transfers to the substrate surface, or wherein the planariser is deposited directly only onto the substrate surface such that the planariser spreads to but, due to de-wetting, does not spread onto the body. In another such different method, the planariser composition may be deposited directly only onto the substrate surface such that the planariser spreads towards and but, due to the repelling, does not contact the body.

The planariser composition may comprise one or more constituents, and may be deposited in liquid form, e.g., by droplet deposition such as for example inkjet deposition, solution processing such as for example spin, dip, slot die or plate coating, etc. to form a liquid on the substrate. Preferably, the composition is compatible with deposition thereon of a charge injection layer, such as a hole injection layer (HIL) and/or a light emissive layer, allows a suitable profile for optimum planarisation, and/or is transmissive to wavelengths of light, e.g., visible light within the range of 400 nm to 700 nm, to be output by a device comprising the planarised substrate. The planariser composition may be electrically conductive or insulating, since a subsequently deposited layer may substantially directly contact the body. An advantage of an embodiment is thus to allow the use of an insulating and light transmissive planariser composition, since highly conductive and transparent polymers are generally more difficult to obtain. Examples of planariser compositions are spin-on glass ('SOG'), SU-8, siloxanes and organic material such as benzocyclobutane (BCB). SU-8 is an epoxy-type, near-UV negative tone photoresist based on EPON SU-8 epoxy resin (from Shell Chemical) that was originally developed, and patented by IBM (e.g. U.S. Pat. No. 4,882,245).

FIG. 2 shows a contact angle A such as that between the body surface and a planariser composition when the composition is deposited on the surface. In an embodiment, the modifying of the wetability comprises depositing a surface modifier on said body surface, said surface modifier to determine such a contact angle. Preferably, the modifying increases the contact angle, preferably to greater than 90 degrees, more preferably greater than 120 degrees, and yet more preferably above 150 degrees.

The surface modifier may be removed later, or may be retained for example if the surface modifier is beneficial for example for work function matching across an interface between the body and a layer subsequently covering the body, e.g., a (hole) charge injection and/or a light emissive layer of an OLED. If the surface modifier is desired to be removed, this may be done for example by dry etching such as plasma etching or reactive ion etching (RIE) using an oxygen containing plasma or ozone plus UV exposure.

The surface modifier, which may adsorb on the body surface, may be deposited by spin-coating or by vapour deposition. The modifier may be HDMS (hexamethyldisilazane) or a surface primer. An example surface modifier forms a self-assembled layer on said body, preferably wherein the self-assembled layer is a self-assembled monolayer (SAM). Thus, the surface modifier may comprise a SAM composition. Such a SAM may comprise molecules each having an anchor group and a functional group linked by a tether. The anchor group may selectively attach to different materials, e.g., may attach to metal and not to glass. An example of an anchor group is a thiol (—SH) group. The functional group may allow dewetting, e.g., may be hydrophobic. This may depend on the type of solvent comprised in the planariser composition. An example of the functional group is a methyl (—CH3).

There may further be provided the method comprising at least partially solidifying said deposited liquid planariser composition to preferably increase the hardness of the planariser composition. Such solidifying may be achieved for example by baking or illuminating the planariser composition on the substrate, e.g., such baking to remove solvent comprised in the composition. The solidifying may cause reflow of the planariser composition, and this may advantageously improve the planarisation. Where the surface modifier is removed from the body before the solidifying, reflowing planariser composition may not be repelled from the body and/or may then contact the side of the body to further improve the planarisation.

There may yet further be provided the method wherein said planariser composition is transmissive to light having a wavelength range of 400 nm to 700 nm, preferably to the whole of this range. Additionally or alternatively, the transmissivity may be to light of a narrower wavelength range, e.g., 450 nm to 495 nm, 620 nm to 700 nm and/or 495 nm to 570 nm. The transmissive nature may mean for example that the planariser composition transmits more than 50%, more than 70% or more than 90% of the light, or most preferably is substantially transparent to the light.

There may further be provided a method comprising depositing a light emissive or photoconductive layer over said planarised surface region, wherein said body comprises a track to conduct electric charge transported by said light emissive layer. There may however be one or more intervening layers between the light emissive or photoconductive layer and the planarised surface region, e.g. a layer to increase charge injection into the light emissive layer, e.g., a hole injection layer (HIL); a HIL may be for example 40 nm to 200 nm thick. The track may be formed in a grid-like structure of conductive tracking. Such a grid may for example conduct electric charge from contacts on the edge of a Lighting Panel through to distributed points across such a light emissive or intervening layer. Thus, the tracking preferably distributes electric current laterally across such a layer. The track may be a metal and indium tin oxide (ITO) may be deposited as the next layer over the planarised surface region to form a substantially transparent anode, and/or the substrate may be substantially transparent, e.g., transmissive to light having a wavelength range of 400 nm to 700 nm and/or one or more of the narrower ranges described previously, and/or may comprise glass.

There may further be provided a method wherein depositing said liquid planariser composition comprises spin-coating said planariser composition onto the substrate and body. There may further be provided the method wherein said spin-coating is performed under predetermined conditions such that said deposited liquid planariser composition has a predetermined thickness, said predetermined conditions comprising one or more of a viscosity of said liquid planariser composition, a concentration of solvent in said liquid planariser composition, a spinning duration and/or a spinning speed. Preferably, the thickness of the deposited planariser composition substantially matches that of the body. Alternatively, the planariser composition may be, e.g., applied by dipping, plating or printing.

There may further be provided a method of forming an electronic device, the method comprising the above method of the first aspect. The electronic device may be for example an Organic Light Emitting Diode (OLED) or an OPV. Other types of lighting or display elements for example comprising OLEDs may be formed by the method. The electronic device may also be a semiconductor device, e.g., a bipolar or a field effect transistor, and/or may be a discrete device or an Integrated Circuit (IC) comprising one or more smaller, integrated electronic devices made according to the method. Thus, there may further be provided a method of forming an IC, the method comprising the above method of the first aspect.

There may further be provided a method of forming a Lighting Panel, the method comprising the above method of the first aspect, the panel for example comprising one or more of the OLEDs. There may further be provided an OLED, an OPV, a Lighting Panel, or an Integrated Circuit formed using the method of the first aspect.

According to a second aspect of the present invention, there is provided a substrate comprising a surface region, a body on said substrate surface region and a planariser composition on said substrate surface region, wherein adjacent regions of said planariser composition and said body have respective thicknesses to provide a substantially planar substrate surface region opposite said substrate surface region and extending across said adjacent regions of said planarising composition and said body, the substrate comprising: a surface modifier on said body, said surface modifier determining a contact angle such that the planariser composition when deposited on said substrate surface region as a liquid wets said substrate surface region and is repelled from said body surface. Preferably, the surface modifier is on the body surface adjacent to the planariser composition.

There may further be provided the substrate, wherein said planariser composition is substantially absent from said body surface, preferably from the entire body. Thus, there may be a continuous gap between the planariser composition and the body surface, even after reflow, e.g., during at least partial solidifying. Thus, a clean break can be observed between said planariser composition and body. The width of such a break is generally insignificant (e.g., a few nm) so that good planarisation is nevertheless achieved.

There may further be provided the substrate, wherein said surface modifier comprises a self-assembled layer, preferably wherein the self-assembled layer is a monolayer.

There may further be provided the substrate, wherein said planariser composition is transmissive to light having a wavelength range of 400 nm to 700 nm and/or one or more of the narrower ranges described previously. There may further be provided the substrate, comprising a light emissive layer over at least a portion of the body, wherein said body comprises a track to conduct electric charge transported by said light emissive layer.

There may further be provided an electronic device comprising the substrate of the second aspect. The electronic device may be for example an Organic Light Emitting Diode or an OPV. There may further be provided a Lighting Panel comprising a plurality of such Organic Light Emitting Diodes.

There may further be provided an Integrated Circuit comprising the substrate of the second aspect.

According to a third aspect of the present invention, there is provided a method of planarising a surface region of a substrate, said substrate having a body on a portion of said surface region, wherein said substrate is transmissive to light of a predetermined wavelength and said body is substantially opaque to light of said predetermined wavelength, the method comprising: depositing a negative tone photosensitive composition on said surface region and on at least a portion of said body; illuminating said negative tone photosensitive composition through said transmissive substrate using light of said predetermined wavelength such that said body portion masks said negative tone photosensitive composition deposited on said body portion; developing said illuminated negative tone photosensitive composition to substantially remove said masked negative tone photosensitive composition.

Thus, at least a portion of an entire surface may be planarised. The location of the body on a portion of the surface region may mean that some of the surface region remains exposed after such a body is formed directly on the surface region. Where the method is performed with at least two such body portions (which may be separate bodies or different portions of a single body), the illuminated negative tone photosensitive composition remaining after the development may be regarded as 'infill' between the portions. Thus, the body portion by acting as a mask may allow self-aligned planarisation preferably infill, whereby the negative tone photosensitive composition remains soluble in a shadow of the body.

The photosensitive composition may have one or more constituents. Preferably, the composition is compatible with deposition thereon of a layer, e.g., a HIL or a light emissive or photoconductive layer, and/or allows a suitable profile for optimum planarisation, and/or is transmissive to wavelengths of light, e.g., visible light having a wavelength range of 400 nm to 700 nm, to be output by a device comprising the planarised substrate. The photosensitive composition may be electrically conductive or insulating, since a subsequently deposited layer may substantially directly contact the body. An advantage of an embodiment is to allow the use of an insulating and light transmissive self-aligned planarising photosensitive composition, since highly conductive and transparent polymers are more difficult to identify. An example of a negative tone photosensitive composition is SU-8 as described previously. An example of a suitable developer for SU-8 is a solvent such as PGMEA (Propylene Glycol Monomethyl Ether Acetate). Preferably, the illuminated negative tone photosensitive composition becomes insoluble to the developer, whereas non-illuminated regions are dissolved by the developer.

The illumination of the negative tone photosensitive composition, e.g., by UV light, may cause cross-linking of the polymer chains in the composition, the cross-linked chains advantageously becoming insoluble to the developer. Conditions of the illumination and/or development may be predetermined, e.g., to over- or under-expose the composition, by illumination intensity and/or duration, in order to optimise the profile of illuminated region(s) of the negative tone photosensitive composition. Preferably, this may optimise the interface between the body and the photosensitive composition remaining after the development, e.g., to provide a substantially uniform thickness of the photosensitive composition remaining after the development to substantially match the thickness of the body, and/or to reduce overlap of the photosensitive composition on the body and/or discontinuities of the planarisation at the interface between the photosensitive composition and the body.

While the method broadly comprises depositing, illuminating and developing the photosensitive composition, there may further be intervening steps between any two of these, e.g., solidifying prior to illuminating. The removal by development may involve dissolving and/or washing away the masked photosensitive composition.

There may further be provided the method, comprising depositing a layer onto said illuminated negative tone photosensitive composition and onto said portion of said body. Thus, the layer may directly contact both the body and the illuminated photosensitive composition that remains after the development.

There may further be provided the method, wherein said depositing comprises spin-coating said negative tone photosensitive composition onto said substrate surface region and onto at least a portion of said body. Alternatively, the photosensitive composition may be applied, e.g., by dipping, plating or printing.

There may further be provided the method, wherein such spin-coating is performed under predetermined conditions such that said deposited negative tone photosensitive composition has a pre-determined thickness, wherein said predetermined conditions comprise one or more of viscosity of said negative tone photosensitive composition, a concentration of solvent in said negative tone photosensitive composition, a spinning duration and/or a spinning speed. Such thickness may be a thickness of the photosensitive composition immediately after spin-coating, after solidifying and/or after development. At least partial solidifying of the deposited photosensitive composition may be achieved for example by baking or illuminating the composition on the substrate, e.g., such baking to remove solvent comprised in the composition. The solidifying may increase the hardness of the deposited photosensitive composition and/or cause reflow of the composition.

There may further be provided the method, wherein said developed negative tone photosensitive composition is transmissive to light having a wavelength range of 400 nm to 700 nm, preferably to the whole of this range. Additionally or alternatively, the transmissivity may be to light of a narrower range, e.g., 450 nm to 495 nm, 620 nm to 700 nm and/or 495 nm to 570 nm. The transmissive nature may mean for example that the composition transmits more than 50%, more than 70% or more than 90% of the light, or most preferably is substantially transparent to the light.

There may further be provided the method, comprising depositing a light emissive or photoconductive layer over at least a portion of said illuminated negative tone photosensitive composition and said portion of the body (e.g., over the entire planarised surface region or entire surface of the substrate), wherein said body comprises a track to conduct electric charge transported by said light emissive layer. There may however be one or more intervening layers between the light emissive or photoconductive layer and planarised surface region, e.g. a layer to increase charge injection into the light emissive layer, e.g., a hole injection layer (HIL). The track may be formed in a grid-like structure of conductive tracking. Such a grid may for example conduct electric charge from contacts on the edge of a Lighting Panel through to distributed points across such a light emissive or an intervening layer. Thus, the tracking preferably distributes electric current laterally across such a layer. The track may be a metal and indium tin oxide (ITO) may be deposited as the next layer over the planarised surface region to form a substantially transparent anode and/or the substrate may be substantially transparent, e.g., transmissive to light having a wavelength range of 400 nm to 700 nm and/or one or more of the narrower ranges described previously, and/or may comprise glass.

There may further be provided a method of forming an electronic device, the method comprising the method of the third aspect. The electronic device may be for example an Organic Light Emitting Diode (OLED) or an OPV. Other types of lighting and display elements for example comprising OLEDs may formed by the method. The electronic device may also be a semiconductor device, e.g., a bipolar or a field effect transistor, and/or may be a discrete device or an Integrated Circuit (IC) comprising one or more smaller, integrated electronic devices made according to the method. Thus, there may further be provided a method of forming an IC, the method comprising the method of the third aspect.

There may further be provided a method of forming a Lighting Panel, the method comprising the method of the third aspect, the lighting panel preferably comprising one or more OLEDs formed by the method of the third aspect.

There may further be provided an OLED, an OPV, Lighting Panel, or Integrated Circuit formed using the method of the third aspect.

According to a fourth aspect of the invention, there is provided a substrate comprising a surface region having a substantially planar surface, the substrate comprising a body on a portion of said surface region and a planariser composition on said surface region and adjacent said body, wherein said planariser composition and said body have respective thicknesses to provide a substantially planar surface region comprising a surface region of said planariser composition and an adjacent surface region said body, wherein said substrate is transmissive to light of a predetermined wavelength and said body is substantially opaque to light of said predetermined wavelength, the substrate comprising: a negative tone photosensitive composition on said surface region and substantially absent from said adjacent body; and a layer on said negative tone photosensitive composition and on said adjacent body. Preferably, the negative tone photosensitive composition is at least partially solidified and/or developed negative tone photosensitive composition.

Preferably, the layer directly contacts the (preferably solidified and/or developed) negative tone photosensitive composition and the body. Where the substrate comprises at least two such bodies, which may be separate bodies or different portions of a single body, the illuminated negative tone photosensitive composition remaining after the development may be regarded as 'infill' between the bodies.

There may further be provided the substrate, wherein said negative tone photosensitive composition is transmissive to light having a wavelength range of 400 nm to 700 nm and/or one or more of the narrower ranges described previously.

There may further be provided the substrate comprising a light emissive layer over at least a portion of said negative tone photosensitive composition and at least a portion of said body, wherein said body comprises a track to conduct electric charge transported by said light emissive layer.

There may further be provided an electronic device comprising the substrate of the fourth aspect. The electronic device may be for example an Organic Light Emitting Diode (OLED) or an OPV. There may further be provided a Lighting Panel comprising a plurality of such OLEDs. The electronic device may also be a semiconductor device, e.g., bipolar or field effect transistor, and/or may be a discrete device or an Integrated Circuit (IC) comprising one or more smaller, integrated electronic devices comprising the substrate. Thus, there may further be provided an IC comprising the substrate of the fourth aspect.

Preferred embodiments are defined in the appended dependent claims.

BRIEF DESCRIPTION OF THE DRAWINGS

For a better understanding of the invention and to show how the same may be carried into effect, reference will now be made, by way of example, to the accompanying drawings, in which:

FIG. 1b shows a view of the OLED of FIG. 1a;

FIG. 4b shows cross-linked planarisation material between the metal tracks of FIG. 4a.

FIG. 4c shows developed planarisation material between the metal tracks of FIG. 4a.

DETAILED DESCRIPTION OF PREFERRED EMBODIMENTS

Figure 1A:
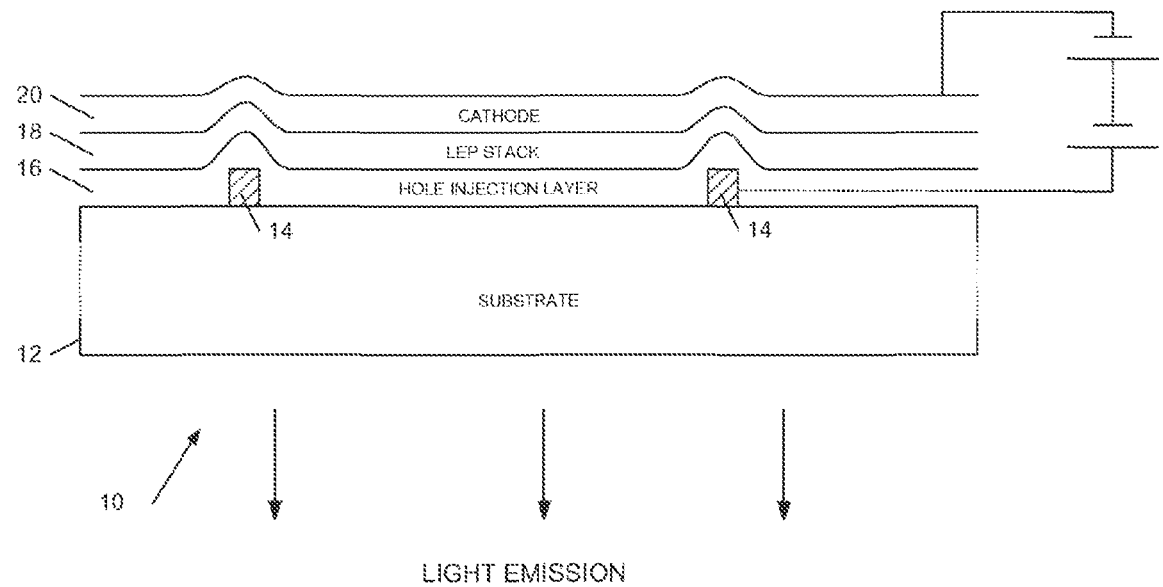
FIG. 1a shows a vertical cross-section through a portion of an organic light emitting diode (OLED)
Figure 1B:
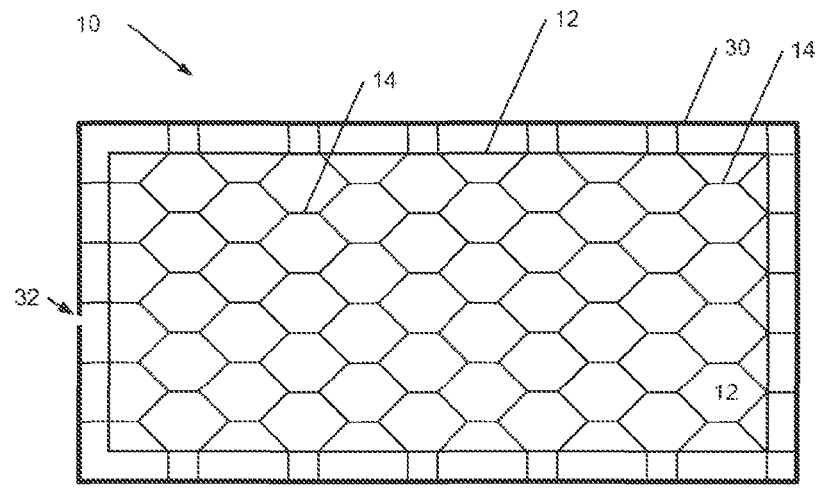
Figure 1C:
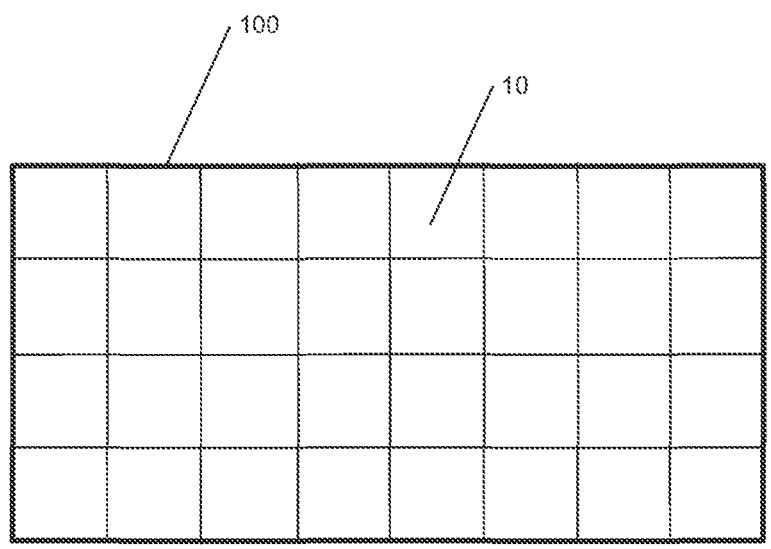
FIG. 1c shows a Lighting Panel 100 comprising a plurality of OLEDs 10 having a structure as shown in FIGS. 1a and/or 1b.
Figure 3A:
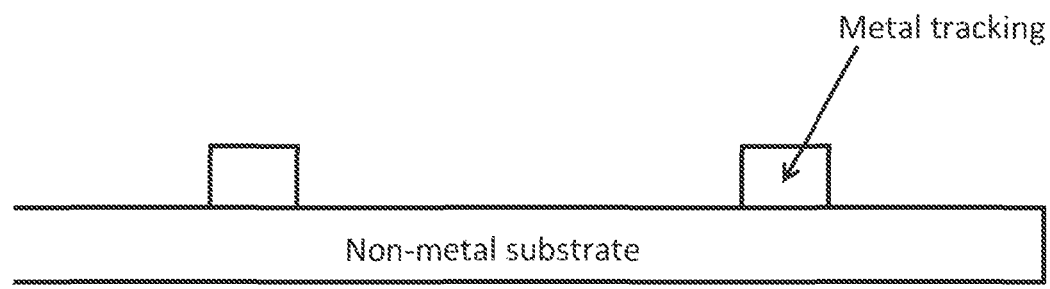
FIG. 3a shows a schematic cross section of metal tracking on a non-metal substrate.

The following generally relates to planarisation based on surface wettability modification or back-illumination. Embodiments of such planarisation may be implemented to improve an OLED structure such as that shown in FIG. 1a preferably having tracking as shown in FIG. 1b and/or comprising a structure as shown in FIG. 3a. Embodiments may reduce or substantially avoid curvature of one or more layers, such curvature being shown above the tracking in FIG. 1a.

By allowing a layer(s) deposited over the planarisation to be substantially planar, electrical conductivity and/or electric field strength may in an embodiment be substantially uniform across each such layer and/or a combination of such layers. This may reduce the risk of device impairment or failure. A region of higher conductivity and/or of field strength may be associated with higher electrical current density compared with neighbouring regions within the layer(s). Such a higher current density may for example be due to thickness variation and/or curvature of a layer where the layer adapts to cover an edge of a body such as a track. This may result in luminance variation across the device. Additionally or alternatively, when current flows through such a region, burn-in may occur so that the region becomes an electrical short across the layer(s), for example between the anode and cathode of an OLED. The higher current density region may then effectively act as a fuse and thus cause failure of the device. In the absence of planarisation, there may be an increased risk of regions of higher current density occurring, for example where the layer(s) are thin compared to the thickness of the tracking and/or the tracking comprises sharp corners such as may result from photolithography processing. (A track of an OLED may be, e.g., 50 nm to 200 nm thick).

As an example of a substrate to be planarised by surface wettability modification or back-illumination, FIG. 3a shows a schematic cross section of metal tracking on a non-metal substrate (such as glass or polymer film). The metal is for example copper (Cu). However, examples of other materials that could be planarised are metals such as Ag, Ti, Pd, Pt, Zn, Al. Other than metals, bodies of semiconductors and insulators and so on could be planarised by embodiments of this method. This may include metal oxides (e.g. Al2O3, TiO2, ZnO), non-metal oxides (e.g. $SiO_2$), transparent conductive oxides (e.g. ITO), semiconductors (e.g. Si, Ge, GaAs, AlAs, InAs, InSb—including all ternary and quarterary alloys of the aforementioned, CdTe, GaN), and/or dielectrics (e.g. Mica).

Embodiments provide infill planarisation of such lighting panel tracking with an insulator as a planariser material, advantageously to give planarisation without covering (and thus insulating) the surface of the tracking structure. This may be realised in embodiments by either employing a selective self-assembled monolayer (SAM) that renders the tracking structure non-wetting, or by using a negative tone photoresist planarisation material and backside self-aligned exposure with the tracking structure as mask.

Infill planarisation by the such SAM- or photoresist (back-illumination)-based embodiments may advantageously provide planarisation material only in "gaps" between the metal tracking, i.e., not on the tracking features. This way the metal track surface remains uncovered after planarisation and may not be electrically insulated from further layers, even if the used planarisation material is insulating. More specifically, this may be achieved by one of the following two method embodiments: (i) using a SAM that attaches to metal and modifies its wettability, in order to modify the metal tracking in OLED lighting panels to enable infill planarisation; or (ii) by employing backside exposure to a negative tone photosensitive planarisation material with the metal tracking as mask, so that the planarisation material may be confined to the "gaps" between the metal tracking by self-aligned photolithography.

Either embodiment may allow planarisation of metal tracking in OLED lighting panels without covering the metal tracking, i.e., without insulating the tracking electrically from the active layers to be deposited on top of the tracking.

Embodiments of the infill planarisation may eliminate or reduce any need for further processing such as an etch-back step when using an insulating planarisation material. This may reduce the cost and/or complexity of the process. Disadvantages associated with such an etch-back step may be avoided, preferably while still using an insulating material that is dedicated to the purpose of planarisation. The planarisation material may be tailored to meet the requirements for both planarisation and optical properties (such as high transparency and refractive index beneficial for outcoupling), but advantageously has neither to be conductive nor to be etched-back after deposition. Instead, it may be confined to the area between the metal tracking by either employing a self-assembled monolayer or by using self-aligned photolithography.

By employing an embodiment of the present invention, there may be no need for a thick conductive hole injection layer to planarise the metal tracking, but a normal, thin hole injection layer may be used for the OLED device stack. Thus, disadvantages of planarisation with a thick hole injection layer may be avoided and/or the hole injection layer may be optimised for its functionality in the OLED without having to fulfill planarisation requirements.

Considering additional or alternative advantages of planarisation embodiments based on either the surface wettability modification or back-illumination, a planarisation material may be used that is well-suited to the application (e.g., material with a refractive index that is beneficial for outcoupling). The planarisation material, for example insulating planarisation material, may not need to be removed to re-expose tracking lines, e.g., for electrical contact with a subsequently deposited layer such as a hole injection layer of an OLED. Further processing steps, e.g., for removing planarisation material, which may introduce the risk of contaminating the active area, e.g., light emissive and/or charge injection layers of an OLED, and/or of corroding metal tracks, may be avoided.

Embodiments may have planarisation material that is sufficiently thin and/or sufficiently transmissive such that for example optical losses are reduced due to the improved optical transparency and/or problems for tuning the OLED cavity are reduced or avoided. Furthermore, the selection of planarisation material is not limited in embodiments, for example to high conductivity materials such as PEDOT:PSS that generally do not have desired optical properties such as high transparency or a refractive index that is beneficial for outcoupling.

Surface Wettability Modification

Generally, a device embodiment such as an OLED may be manufactured using a method for filling gaps between metal tracks by depositing the planarising material on SAM-modified metal tracks.

Such an embodiment may provide infill planarisation of lighting panel tracking using an insulator designed to give planarisation, advantageously without covering (and thus insulating) the surface of the metal tracking structure. This may be realised by employing a selective self-assembled monolayer (SAM) that modifies the tracking structure surface, preferably rendering the tracking structure substantially non-wetting.

Figure 2:
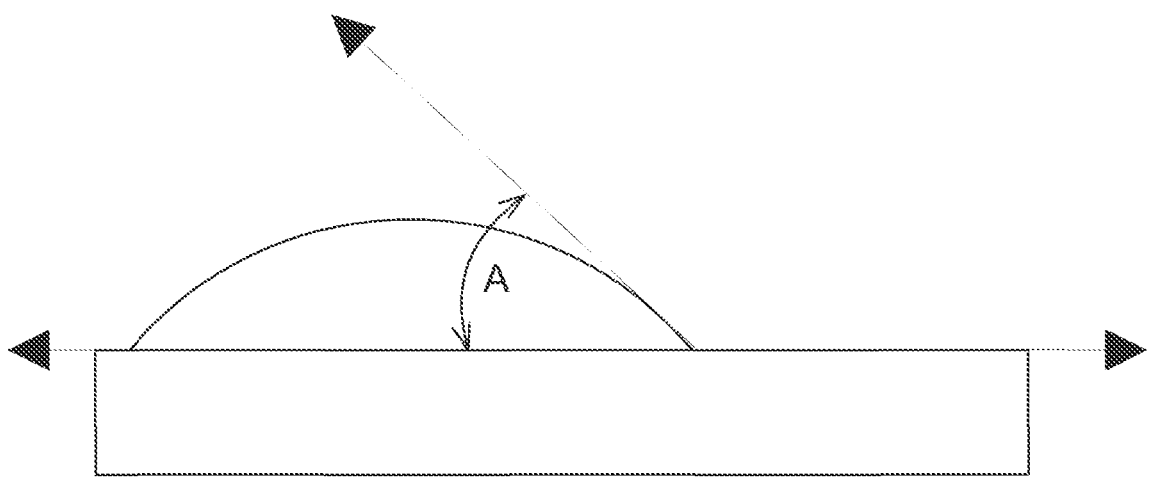
FIG. 2 illustrates a contact angle A of a liquid droplet on a surface.

Such modification may be achieved by increasing a contact angle of the planarisation material on the tracking. For further clarity, FIG. 2 illustrates a liquid planarisation material droplet on a flat surface, wherein the contact angle is the angle between the flat surface and a tangent to the droplet's exposed surface where the droplet meets the flat surface. Where the droplet is on a curved surface, e.g., where the tracking is not completely flat, the contact angle may be the angle between the surface and a tangent to the droplet's exposed surface where the droplet meets the curved surface.

The embodiment may employ a dedicated, insulating planarisation layer with the advantage of rendering a further processing step such as an etch-back step unnecessary.

Figure 3B:
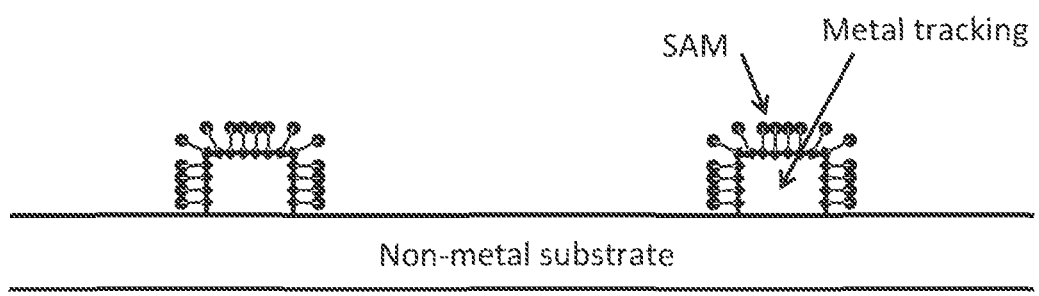
FIG. 3b shows a self-assembled monolayer (SAM) applied to a substrate with metal tracking in an embodiment.

Prior to spin-coating the planarisation material, a self-assembled monolayer (SAM) composition may be applied to the substrate with the metal tracking (FIG. 3b). This SAM has two functional groups. One group (the head group) (indicated by the rhombus) selectively attaches to the metal, but not to the substrate material. An example for a functional group that attaches to metals such as Cu, Au and Ni, amongst others, is the thiol group —SH. The other functional group (the tail group) (indicated by circles) provides non-wettability (a high contact-angle) to the liquid planarisation material. —CH3 is an example of such a group in case the planarisation material is processed as a polar liquid.

Figure 3C:
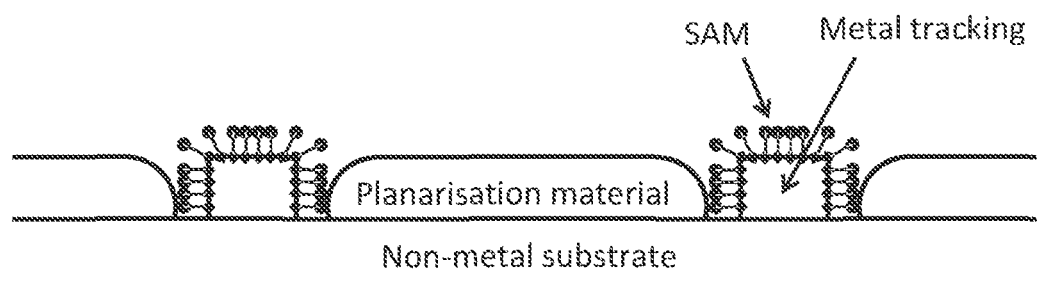
FIG. 3c shows planarisation material de-wetted from the SAM treated metal track of FIG. 3b.

Upon application of the planarisation material, the material may substantially de-wet from the SAM treated metal track and only fill in the gaps between the tracks, as shown in FIG. 3c. The OLED may then be processed directly on the planarised metal tracking.

The following concerns examples of specific SAMs that may be used as a tracking surface modifier in embodiments. Table 1 below indicates example functional head groups of SAMs for selectively attaching to different materials.

TABLE 1

| Name | Formula | Attaches to, e.g., |
| --- | --- | --- |
| 1-Alkenes | RHC=CH2 | Si |
| Carboxylic acid* | RCOOH | Al2O3, Ni, Ti, TiO2 |
| Primary amines | RNH2 | CdSe, Mica |
| Nitrile | RC≡N | Ag |
| Thiol | RSH | Ag, Au, CdTe, CdS, Cr, Cu, GaAs, Ge, InP, Ni, Pd, Pt, Zn |
| Phosphonic acid** | RPO(OH)2 | Al, GaAs, GaN, ITO, TiO2, Mica |

*Attaches also to glass SiO2, so this functional group may be less easily used for selectively attaching to, e.g., Ti tracks on a glass substrate.
**May also attach to glass SiO2, so this functional group may be less easily used for selectively attaching to, e.g., Al tracks on a glass substrate.

* Attaches also to glass SiO2, so this functional group may be less easily used for selectively attaching to, e.g., Ti tracks on a glass substrate.
** May also attach to glass SiO2, so this functional group may be less easily used for selectively attaching to, e.g., Al tracks on a glass substrate.

Regarding examples of a spacer/tether between head and tail groups, these may be hydrocarbon chains, and/or could be saturated or unsaturated, linear or branched, halogenated or non-halogenated, monomeric or polymeric. Specific examples are linear alkyl-like chains such as C4H8 or C9H18.

Table 2 below indicates example functional non-wetting (or hydrophobic) tail groups of the SAMs.

TABLE 2

| Alkyl | RCH3 |
| Alkenyl | RC=CH2 |
| Alkynyl | RC≡CH |
| Aryl, e.g. Phenyl | RC6H5 |

Each one of the above could also be partly or wholly fluorinated for even greater hydrophobicity. In the case where this leads to a permanent dipole moment in the functional group, this may also help injection of charge carriers from the metal in the light emitting layer stack on top. Fluorophenyl head groups, for example, may be used to help hole injection.

Examples for planarisation materials which would be suitable for in-fill of the metal tracking include siloxane polymers which are sometimes commonly referred to as spin-on-glass (SOG). SOG has excellent adhesion to $SiO_2$ surfaces and is well known for its excellent gap filling capability. The combination of $SOG/SiO_2$ is already widely used in the semiconductor industry as an effective planarisation layer. There are many types of SOG materials that are transparent after being cured. SOG can be easily applied by spinning, dipping, printing, slot coating, or exposure to mist. Before deposition, the SOG should be brought to room temperature and then spun with a typical thickness of 500 Å to 5 micrometers (as for a typical photoresist spin process). Typically, a SOG material requires a curing temperature of 400° C., however, for this application, an SOG layer is required to be highly optically transparent and may be cured at a much lower temperature, for example 150° C., with longer baking time, or at room temperature with IR lamp radiation. Examples of suitable SOG materials are disclosed in the prior art references U.S. Pat. Nos. 6,674,106, 7,445,953, and WO2009108574.

The following describes an example 'recipe' for performing an embodiment. The embodiment starts with a glass substrate that has Au tracks. The substrate is rinsed with acetone and subsequently cleaned in iso-propanol (IPA) (ultrasonic bath for 10 min) and afterwards blow-dried with nitrogen ($N_2$). The SAM material 3,3,4,4,5,5,6,6,6-Nonafluoro-1-hexanethiol is available from Sigma-Aldrich (Product no. 16494). A 1millimolar solution of the SAM material in Methanol is prepared and the cleaned substrate is immersed in the solution for 24 h. To remove excessive 3,3,4,4,5,5,6,6,6-Nonafluoro-1-hexanethiol from the substrate after the formation of the SAM, the substrate is thoroughly rinsed with methanol after it has been removed from the SAM solution. After being blown dry with $N_2$, the substrate features the SAM modified Au tracks, which are now non-wetting (or hydrophobic), and are ready for planarising. The SOG should be brought to room temperature and then can be spun on with a typical thickness of 500 Å to 5 micrometers (as for a typical photoresist spin process). Typically, a SOG material requires a curing temperature of 400° C., however, for this application, an SOG layer is required to be highly optically transparent and may be cured at a much lower temperature, for example 150° C., with longer baking time, or at room temperature with IR lamp radiation. Examples of suitable SOG materials are disclosed in the prior art references U.S. Pat. Nos. 6,674,106, 7,445,953, and WO2009108574.

Back-Illumination Modification

Figure 4A:
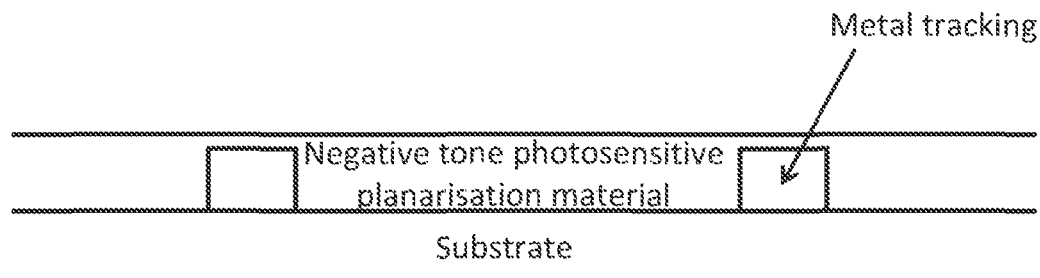
FIG. 4a shows photoresist spin-coated over an entire substrate, including the metal tracking, in another embodiment.

An embodiment uses a planarisation material that has the photosensitive properties of a negative tone photoresist. The photoresist may be spincoated over the entire substrate, including the metal tracking, as shown in FIG. 4a.

Figure 4B:
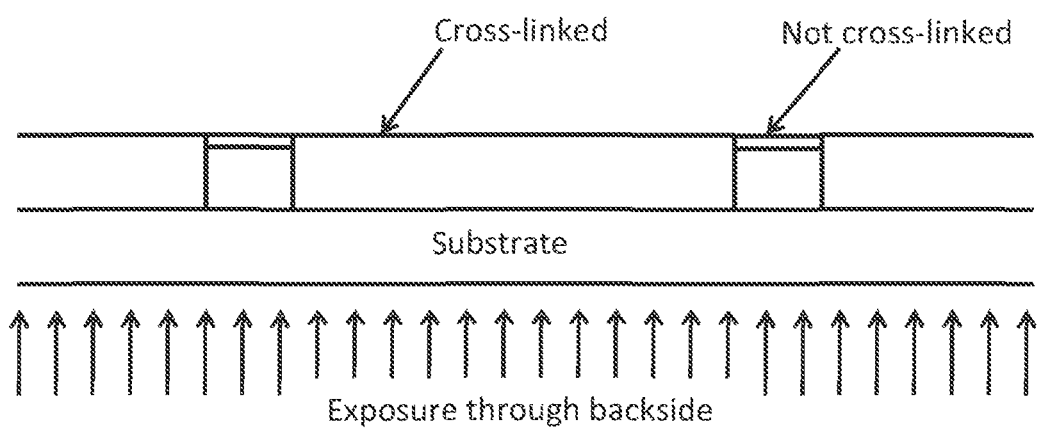

The substrate may be flood exposed with light of a wavelength to which the photoresist is photosensitive. The exposure may be done through the backside of the substrate. Thus, the opaque metal tracking may act as a photomask during the exposure process. Since a negative tone photoresist is used, only the planarisation material between the metal tracks may become cross-linked (FIG. 4b), i.e., the material deposited on top of the metal tracks is not cross-linked. The metal on top of the tracks may thus remain dissolvable in a photoresist developer. Examples of a negative tone photoresist and associated developer are SU-8 and PGMEA (Propylene Glycol Methyl Ether Acetate), respectively.

Figure 4C:
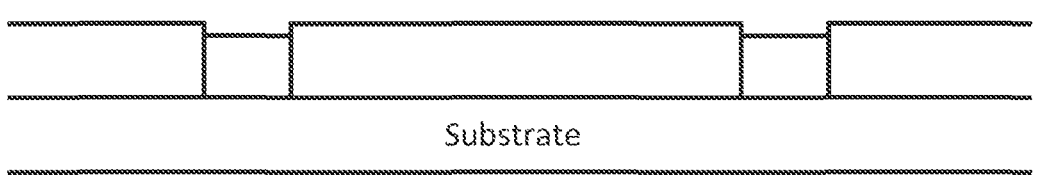

Developing the exposed photosensitive planarisation material may remove the non-cross-linked material on top of the metal tracks but retain the planarisation material between the metal tracks (FIG. 4c). Since in the embodiment the metal tracking is not covered by the planarisation material and thus is not electrically insulated from any layers subsequently deposited over the planarised tracking, the OLED may then be processed on the planarised metal tracking.

Negative resists that may be suitable for the planarising process would include most chemically amplified negative photoresists such as SU-8. Usually these are epoxy or resin based and therefore are highly transparent. Other suitable examples may be the zeon material from Zeon Corporation, AZnLOF based materials from AZ Electronic Materials or Futurrex negative photoresists (NR9 series for example). The skilled person would recognise that there are many more suitable materials.

The specific process (and chosen negative photoresist material) may depend on the height of the device for planarisation. The solvent content of the chosen photoresist may be tunable to achieve the specific required thickness at the desired spin speed.

In a specific example, the negative photoresist process is based on SU-8-2000.5 to planarise tracks of a height of 600 nm. However, there are many variations of this process which will still achieve desirable results. The specific example is described below:

dispense 1 ml of resist for each inch (25 mm) of substrate diameter;

spin at 500 rpm for 5-10 seconds with acceleration of 100 rpm/second to spread out the resist over the substrate;

spin at 2000 rpm for 30 seconds with acceleration of 300 rpm/second;

perform edge beam removal and reverse side clean with Microchem EBR solution (for example if the tool has the necessary equipment);

soft bake at 95° C. for 2 minute on a hotplate;

flood expose from the backside of the substrate using a UV Hg lamp centred at 365 nm with an exposure energy of 200 mJ/cm$^2$ to achieve cross linking (100 mJ/cm$^2$ would also be sufficient);

post exposure bake 95° C. for 2 mins on a hotplate;

develop with PGMA; then hardbake at 150° C. or above for 30 minutes.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A method of planarizing a surface region of a substrate, said substrate having a body on a portion of said substrate surface region, wherein said substrate is transmissive to light of a predetermined wavelength and said body is substantially opaque to light of said predetermined wavelength, the method comprising:

depositing negative tone photosensitive composition on said substrate surface region and on at least a portion of said body;

illuminating said negative tone photosensitive composition through said transmissive substrate using light of said predetermined wavelength such that said body portion masks said negative tone photosensitive composition deposited on said body portion;

developing said illuminated negative tone photosensitive composition to substantially remove said masked negative tone photosensitive composition from said body portion, while leaving said negative tone photosensitive composition on said substrate surface region, such that adjacent regions of said body portion and said negative tone photosensitive composition on said surface region have respective thicknesses to provide a substantially planar surface opposite said substrate surface region and extending across said adjacent regions.

2. The method of claim 1, wherein said depositing comprises spin-coating said negative tone photosensitive composition onto said substrate surface region and onto at least a portion of said body.

3. The method of claim 2, wherein said spin-coating is performed under predetermined conditions such that said deposited negative tone photosensitive composition has a pre-determined thickness, wherein said predetermined conditions comprise one or more of viscosity of said negative tone photosensitive composition, a concentration of solvent in said negative tone photosensitive composition, a spinning duration and/or a spinning speed.

4. A substrate comprising a surface region having a substantially planar surface, the substrate comprising a body on a portion of said surface region and a planarizer composition on said surface region and adjacent said body, wherein said planarizer composition and said body have respective thicknesses to provide a substantially planar surface comprising a surface region of said planarizer composition and an adjacent surface region of said body, wherein said substrate is transmissive to light of a predetermined wavelength and said body is substantially opaque to light of said predetermined wavelength, the substrate comprising:
   the planarizer composition comprising a negative tone photosensitive composition, said planarizer composition being disposed on said surface region and being substantially absent from said adjacent body; and
   a layer on said negative tone photosensitive composition and on said adjacent body.

5. An electronic device comprising the substrate of claim 4.

6. The electronic device of claim 5, wherein the device is an Organic Light Emitting Diode (OLED).

7. The electronic device of claim 5, wherein the device is an Organic Photovoltaic (OPV) device.

8. A Lighting Panel comprising a plurality of OLEDs of claim 6.

9. An Integrated Circuit comprising the substrate of claim 4.

* * * * *